United States Patent
Lin

(10) Patent No.: US 11,821,105 B2
(45) Date of Patent: Nov. 21, 2023

(54) SILICON CARBIDE SEED CRYSTAL AND METHOD OF MANUFACTURING SILICON CARBIDE INGOT

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 91 days.

(21) Appl. No.: 17/385,912

(22) Filed: Jul. 27, 2021

(65) Prior Publication Data
US 2022/0025542 A1    Jan. 27, 2022

Related U.S. Application Data

(60) Provisional application No. 63/056,728, filed on Jul. 27, 2020, provisional application No. 63/056,729, filed on Jul. 27, 2020.

(51) Int. Cl.
| | |
|---|---|
| C30B 23/02 | (2006.01) |
| C30B 29/36 | (2006.01) |
| C30B 23/06 | (2006.01) |
| C01B 32/956 | (2017.01) |
| H01L 29/30 | (2006.01) |

(52) U.S. Cl.
CPC .......... *C30B 23/025* (2013.01); *C30B 23/066* (2013.01); *C30B 29/36* (2013.01); *C01B 32/956* (2017.08); *H01L 29/30* (2013.01)

(58) Field of Classification Search
CPC ..... C30B 23/025; C30B 23/066; C30B 29/36; C30B 23/063; C30B 23/002; C01B 32/956; H01L 29/30
See application file for complete search history.

(56) References Cited

U.S. PATENT DOCUMENTS

| | | | | |
|---|---|---|---|---|
| 5,911,864 A | * | 6/1999 | Eldridge | ............ C25F 3/12 |
| | | | | 205/684 |
| 2015/0068446 A1 | * | 3/2015 | Drachev | ............ C30B 29/36 |
| | | | | 156/60 |

FOREIGN PATENT DOCUMENTS

| | | |
|---|---|---|
| CN | 109957838 | 7/2019 |
| TW | 201915231 | 4/2019 |

OTHER PUBLICATIONS

Jaewoon Lee, Thesis: Evolution of Extended Defects in PVT-grown 4H-SiC Single Crystals, 2008, pp. 1-110 (Year: 2008).*
"Office Action of Taiwan Counterpart Application", dated Jun. 7, 2022, p. 1-p. 7.

* cited by examiner

*Primary Examiner* — Steven J Bos
*Assistant Examiner* — Syed T Iqbal
(74) *Attorney, Agent, or Firm* — JCIPRNET

(57) ABSTRACT

The disclosure provides a silicon carbide seed crystal and a method of manufacturing a silicon carbide ingot. The silicon carbide seed crystal has a silicon surface and a carbon surface opposite to the silicon surface. A difference D between a basal plane dislocation density BPD1 of the silicon surface and a basal plane dislocation density BPD2 of the carbon surface satisfies the following formula (1), a local thickness variation (LTV) of the silicon carbide seed crystal is 2.5 μm or less, and a stacking fault (SF) density of the silicon carbide seed crystal is 10 EA/cm² or less:

$$D=(BPD1-BPD2)/BPD1 \leq 25\% \qquad (1).$$

5 Claims, 3 Drawing Sheets

SILICON CARBIDE SEED CRYSTAL AND METHOD OF MANUFACTURING SILICON CARBIDE INGOT

CROSS-REFERENCE TO RELATED APPLICATION

This application claims the priority benefit of U.S. provisional application Ser. No. 63/056,728, filed on Jul. 27, 2020 and U.S. provisional application Ser. No. 63/056,729, filed on Jul. 27, 2020. The entirety of each of the above-mentioned patent applications is hereby incorporated by reference herein and made a part of this specification.

BACKGROUND

Technology Field

The disclosure relates to a semiconductor seed crystal and a method of manufacturing the same, and a method of manufacturing a semiconductor ingot, and particularly relates to a silicon carbide seed crystal and a manufacturing method thereof.

Description of Related Art

In the semiconductor industry, the method of manufacturing wafers includes first forming an ingot, and then slicing the ingot to obtain wafers. The ingot is manufactured in a high-temperature environment, for example. In a common ingot manufacturing method, a seed crystal is disposed in a high-temperature furnace, the seed crystal is in contact with a gaseous or liquid raw material, and a semiconductor material is formed on the surface of the seed crystal until an ingot of the desired size is obtained. Ingots can have different crystal structures depending on the manufacturing method and manufacturing materials.

In the process of crystal growth, the quality of the seed crystal is a key factor affecting the quality of the grown crystal. For example, taking the silicon carbide seed crystal as an example, if the quality of the silicon carbide seed crystal is not good, many defects may accordingly occur due to different growth directions during the crystal growth process, and the yield is affected, so silicon carbide ingots with good quality cannot be grown.

SUMMARY

The disclosure provides a silicon carbide seed crystal having a small basal plane dislocation (BPD) density difference between the two opposite sides of the silicon surface and the carbon surface, and the local thickness variation (LTV) of the silicon carbide seed crystal is 2.5 μm or less, and the stacking fault (SF) density of the silicon carbide seed crystal is 10 EA/cm$^2$ or less. With a silicon carbide seed crystal that meet the structural characteristics, silicon carbide ingots can grow in a consistent direction during the growth process, accordingly the structural defects of the silicon carbide ingots grown from the silicon carbide seed crystal can be reduced, and high-quality silicon carbide ingots can be obtained.

The disclosure also provides a method of manufacturing a silicon carbide seed crystal. The silicon carbide seed crystal can be formed by adjusting the temperature gradient to meet a specific range so that the silicon carbide seed crystal meeting the structural characteristics can be used to grow high-quality silicon carbide ingots.

The silicon carbide seed crystal of the disclosure has a silicon surface and a carbon surface opposite to the silicon surface. A difference D between the basal dislocation density BPD1 of the silicon surface and the basal dislocation density BPD2 of the carbon surface satisfies the following formula (1), the local thickness variation (LTV) of the silicon carbide seed crystal is 2.5 μm or less, and the stacking fault (SF) density of the silicon carbide seed crystal is 10 EA/cm$^2$ or less.

$$D=(BPD1-BPD2)/BPD1 \leq 25\% \quad (1).$$

In an embodiment of the disclosure, the basal plane dislocation density difference D between the silicon surface and the carbon surface is preferably 20% or less, more preferably 15% or less.

In an embodiment of the disclosure, the local thickness variation (LTV) of the silicon carbide seed crystal is 1.5 μm or less.

In an embodiment of the disclosure, the stacking fault (SF) density is 5 EA/cm$^2$ or less.

In an embodiment of the disclosure, the local thickness variation (LTV) and the stacking fault (SF) density are values measured after processing.

The disclosure provides a method for manufacturing a silicon carbide ingot using the silicon carbide seed crystal. The method includes steps as follows. The silicon carbide seed crystal is disposed on a top of a crucible. A silicon carbide based raw material is disposed in the crucible. The silicon carbide based raw material is heated to form a thermal field in the crucible so that the silicon carbide based raw material is sublimated in the thermal field of the crucible. A radial temperature gradient of the thermal field in the crucible is greater than or equal to 5° C./cm and less than or equal to 50° C./cm. The sublimed silicon carbide is grown into a silicon carbide single crystal after being in contact with the silicon carbide seed crystal disposed on the top of the crucible. The silicon carbide single crystal is grown continuously on the silicon carbide seed crystal to obtain silicon carbide ingots.

In an embodiment of the method of manufacturing the silicon carbide ingot of the disclosure, the radial temperature gradient is greater than or equal to 5° C./cm and less than or equal to 45° C./cm.

In an embodiment of the method of manufacturing the silicon carbide ingot of the disclosure, a basal plane dislocation density (BPD) of a carbon surface of the grown silicon carbide ingot is 300 EA/cm$^2$ or less, a stacking fault (SF) density of the carbon surface of the grown silicon carbide ingot is 10 EA/cm$^2$ or less, and a threading screw dislocation (TSD) density of the carbon surface of the grown silicon carbide ingot is 35 EA/cm$^2$ or less.

In summary, in the silicon carbide seed crystal of the disclosure, the basal plane dislocation density difference D, the local thickness variation (LTV), and the stacking fault (SF) density between the silicon surface and the carbon surface are controlled to meet a specific range, thereby allowing the crystal growth direction to be consistent to manufacture high-quality silicon carbide ingots with few defects. The disclosure also provides a method of manufacturing a silicon carbide ingot using the silicon carbide seed crystal. The silicon carbide seed crystal having small basal plane dislocation density difference between the silicon surface and the carbon surface, small local thickness variation (LTV), and low stacking fault (SF) density is used to grow the silicon carbide ingot, and by controlling the radial temperature gradient of the grown ingot to meet a specific range, high-quality silicon carbide ingots with few defects can be formed accordingly.

DESCRIPTION OF THE EMBODIMENTS

Figure 1:
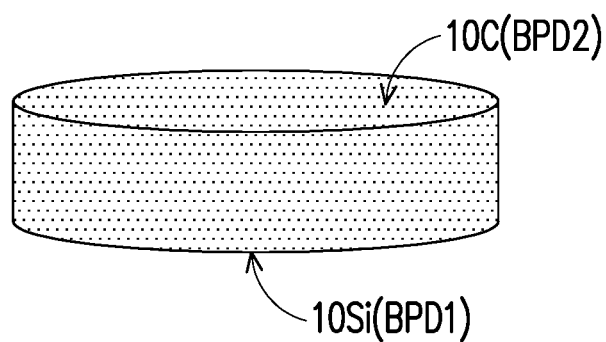
FIG. 1 is a schematic view of a silicon carbide seed crystal according to an embodiment of the disclosure.

The exemplary embodiments of the disclosure will be fully described below with reference to the drawings, but the disclosure may also be implemented in many different forms and should not be construed as being limited to the embodiments described herein. In the drawings, for clarity, a relative size, a thickness, and a location of each region, portion, and/or layer may not be necessarily drawn to scale.

<Silicon Carbide Seed Crystal>

FIG. 1 is a schematic view of a silicon carbide seed crystal according to an embodiment of the disclosure. As shown in FIG. 1, a silicon carbide seed crystal 10 has a silicon surface 10Si and a carbon surface 10C opposite to the silicon surface 10Si. Note that the silicon carbide seed crystal 10 of the disclosure satisfies the following three requirements. Specifically, requirement 1 is that a difference between a basal plane dislocation density BPD1 of the silicon surface 10Si and a basal plane dislocation density BPD2 of the carbon surface 10C of the silicon carbide seed crystal 10 satisfies the following formula (1). Requirement 2 is that a local thickness variation (LTV) of the silicon carbide seed crystal is 2.5 μm or less, and requirement 3 is that a stacking fault (SF) density of the silicon carbide seed crystal is 10 EA/cm² or less $$D=(BPD1-BPD2)/BPD1 \leq 25\% \qquad (1).$$

Specifically, in the disclosure, with the silicon carbide seed crystal having the basal plane dislocation density difference D between the two opposing surfaces of 25% or less, the local thickness variation (LTV) of 2.5 μm or less, and the stacking fault (SF) density of 10 EA/cm², the basal plane dislocation density difference D between the growth surface and the surface opposite to the growth surface is controlled within a specific range, and the local thickness variation (LTV) and the stacking fault (SF) density are low, which ensures that the ingot grown from the silicon carbide seed crystal can have a high-quality structure with few defects. The growth surface of the silicon carbide seed crystal of the disclosure can be a carbon surface 10C or a silicon surface 10Si, the processing process can include cutting, grinding, and polishing, the silicon carbide seed crystal 10 can be 6H silicon carbide or 4H silicon carbide, and the disclosure is not limited thereto.

Taking the carbon surface 10C as the growth surface as an example, in the disclosure, the relationship between the basal plane dislocation density BPD2 of the carbon surface 10C as the growth surface in the silicon carbide seed crystal 10 and the basal plane dislocation density BPD1 of the silicon surface 10Si which is the other side of the silicon carbide seed crystal 10 satisfies formula (1), so in ingot growth process, this can solve the defect problem resulting from the ingots growing in different directions due to the poor quality of the seed crystal during the crystal growth process, especially the problem of a higher density of defects around the seed crystal of the ingots obtained in the example. If there are many defects in the silicon carbide ingots, the silicon carbide wafers cut from the silicon carbide ingots may also have the defects and cannot be used as silicon carbide seed crystals 10. Taking the basal plane dislocation density as an example, the basal plane dislocation density of the obtained silicon carbide ingot may extend to the epitaxial layer, causing shockley-type stacking faults in various layers of the epitaxial layer, resulting in increased leakage current of the element, reducing the performance of the electronic element, and reducing the number of the yield of elements available.

Moreover, the local thickness variation (LTV) of the silicon carbide seed crystal 10 is 2.5 μm or less, so that high-quality silicon carbide seed crystals with low defects can be grown. As an indicator of the local thickness variation of the silicon carbide seed crystal 10, for example, the height of a local protrusion or depression of the crystalline substrate is the local thickness variation. Specifically, the local thickness variation (LTV) of the silicon carbide seed crystal 10 can be further controlled to be 1.5 μm or less, the silicon carbide seed crystals grown therefrom have fewer defects, and thus the quality of the film formed by subsequent epitaxy can be ensured. In the embodiment, before the local thickness variation (LTV) is measured, a process, such as grinding and polishing, can be performed on the surface of the silicon carbide seed crystal 10, but the disclosure is not limited thereto.

Moreover, the stacking fault (SF) density is controlled to be 10 EA/cm² or less. Accordingly, due to the low stacking fault (SF) density, the quality of the film layer formed by the subsequent epitaxy can be ensured. The stacking fault (SF) density is more preferably controlled to be 5 EA/cm² or less. In the embodiment, a process such as grinding and polishing can be performed on the surface of the silicon carbide seed crystal 10 before the stacking fault (SF) density is measured, but the disclosure is not limited thereto. In the embodiment, for example, the thickness of the silicon carbide seed crystal 10 ranges from 8 mm to 50 mm, preferably from 17 mm to 20 mm.

In the embodiment, for example, the detection of the basal plane dislocation density (BPD) can be analyzed with the following methods. The silicon carbide ingot is etched with KOH at 500° C., and then a measuring instrument such as automated optical inspection (AOI) instrument is used to calculate the number of BPD per unit area. The AOI instrument is a high-speed and high-precision optical image inspection system including applications such as measurement lens technology, optical lighting technology, positioning measurement technology, electronic circuit testing technology, image processing technology, automation technology, and the like. The AOI instrument uses machine vision as the testing standard technology. The measuring instrument uses optical instruments to obtain the surface condition of a finished product, and then computer image processing technology is used to detect defects such as foreign objects or abnormal patterns.

In the embodiment, the detection of the local thickness variation (LTV) can be analyzed by an optical instrument, for example. Moreover, the detection of the stacking fault (SF) density can be analyzed by X-ray diffraction topology (XRT), for example, and the disclosure is not limited thereto. Moreover, in the embodiment, the surface of the seed crystal can be polished and ground, and then the local thickness variation (LTV) and the stacking fault (SF) density can be measured. The polishing and grinding process, for example, uses chemical mechanical polishing (CMP) to process the silicon carbide wafers to form silicon carbide seed crystal 10. During CMP, the pressure is greater than 15 g/cm², the polishing speed is not less than 15 rpm, and the time ranges from 0.5 to 6 hours.

In the embodiment, the basal plane dislocation density difference D between the silicon surface 10Si and the carbon surface 10C is 25% or less, preferably 20% or less, more preferably 15% or less, 10% or less, and most preferably 5% or less. In other embodiments, it may be 3% to 5%, 3% to 10%, 3% to 25%, 5% to 10%, 5% to 25%, and 10% to 25%. The basal plane dislocation density BPD1 of the silicon surface 10Si in the silicon carbide seed crystal 10 can range from 70 to 300 EA/cm², preferably 70 to 200 EA/cm². In other embodiments, it can range from 70 to 130 EA/cm², or 70 to 90 EA/cm². The basal plane dislocation density BPD2 of the carbon surface 10C in the silicon carbide seed crystal 10 can range from 70 to 300 EA/cm², preferably 70 to 170 EA/cm². In other embodiments, it may be 70 to 120 EA/cm², or 70 to 90 EA/cm², but the disclosure is not limited thereto.

In the disclosure, the local thickness variation (LTV) is 2.5 μm or less, preferably 1.5 μm or less, more preferably 1.4 μm or less, 0.5 μm or less, and most preferably 0.3 μm or less. Moreover, in the disclosure, the stacking fault (SF) density is 10 EA/cm² or less, preferably 9 EA/cm² or less, more preferably 8 EA/cm² or less, 5 EA/cm² or less, most preferably 4 EA/cm² or less. The local thickness variation (LTV) may be the local thickness variation (LTV) of a carbon surface or a silicon surface, the stacking fault (SF) density may be the stacking fault (SF) density of a carbon surface or a silicon surface, and the disclosure is not limited thereto. In the embodiment, the processing process of the silicon carbide seed crystal 10 may include cutting, grinding, polishing, etching, and/or other processes, and the disclosure is not limited thereto.

A method of manufacturing silicon carbide ingots using the silicon carbide seed crystal is illustrated in the following paragraphs.

<The Method of Manufacturing Silicon Carbide Ingots Grown Using the Silicon Carbide Seed Crystal>

Figure 2:
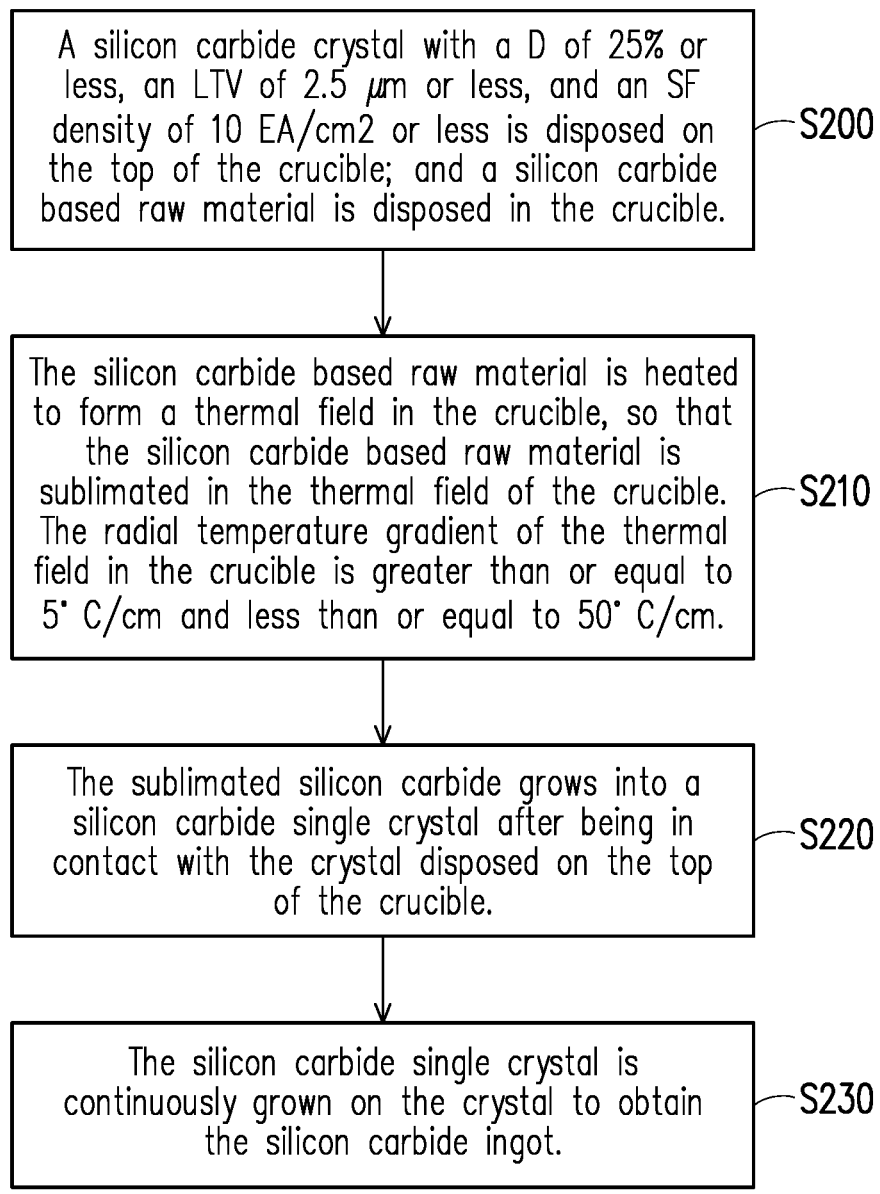
FIG. 2 is a flow chart illustrating the preparation for a silicon carbide ingot according to an embodiment of the disclosure.

FIG. 2 is a flow chart illustrating the preparation for a silicon carbide ingot according to an embodiment of the disclosure.

Referring to FIG. 2, in step S200, a silicon carbide seed crystal with a D of 25% or less, an LTV of 2.5 μm or less, and an SF density of 10 EA/cm² or less is disposed on the top of the crucible; and a silicon carbide based raw material is disposed in the crucible. In step S210, the silicon carbide based raw material is heated to form a thermal field in the crucible, so that the silicon carbide based raw material is sublimated in the thermal field of the crucible. Note that the radial temperature gradient of the thermal field in the crucible is controlled to be less than or equal to 50° C./cm, and therefore the defects are prevented from being generated in the crystal growth process. If the radial temperature gradient of the thermal field in the crucible is above 50° C./cm, the basal plane dislocation density of the grown silicon carbide ingot may increase, causing too many defects in the grown silicon carbide ingots, resulting in poor quality of the subsequent processing and epitaxy process. Moreover, taking into account the process time, the radial temperature gradient of the thermal field in the crucible is limited to as low as preferably 5° C./cm or more. Furthermore, the radial temperature gradient of the thermal field in the crucible may be controlled to range from 5° C./cm to 30° C./cm or 5° C./cm to 25° C./cm in the subsequent process, but the disclosure is not limited thereto.

More specifically, referring to FIG. 2, when the radial temperature gradient of the thermal field in the crucible is controlled to be less than or equal to 50° C./cm, in step S220, the sublimated silicon carbide is grown into a silicon carbide single crystal after being in contact with the seed crystal disposed on the top of the crucible. Next, in step S230, the silicon carbide single crystal is continuously grown on the seed crystal to obtain the silicon carbide ingot. In the embodiment, the basal plane dislocation density BPD of the carbon surface of the silicon carbide ingot grown by this is 300 EA/cm² or less, the stacking fault (SF) density is 10 EA/cm² or less, and the threading screw dislocation (TSD) density is 35 EA/cm² or less. The threading screw dislocation (TSD) density of the ingot can be first etched with KOH at 400 to 550° C. to etch the silicon carbide ingot and then measured by a microscope or an AOI instrument.

With the method for manufacturing silicon carbide seed crystals of the disclosure, high-quality silicon carbide ingots with few defects can be obtained, and therefore multiple high-quality silicon carbide wafers with few defects can be formed after processing.

In the method of manufacturing silicon carbide seed crystal of the disclosure, by using the silicon carbide seed crystals that satisfy the requirements 1 to 3 and controlling the radial temperature gradient of the thermal field in the crucible to be less than or equal to 50° C./cm to process the silicon carbide ingots, high-quality silicon carbide seed crystals with few defects can be processed accordingly.

Figure 3:
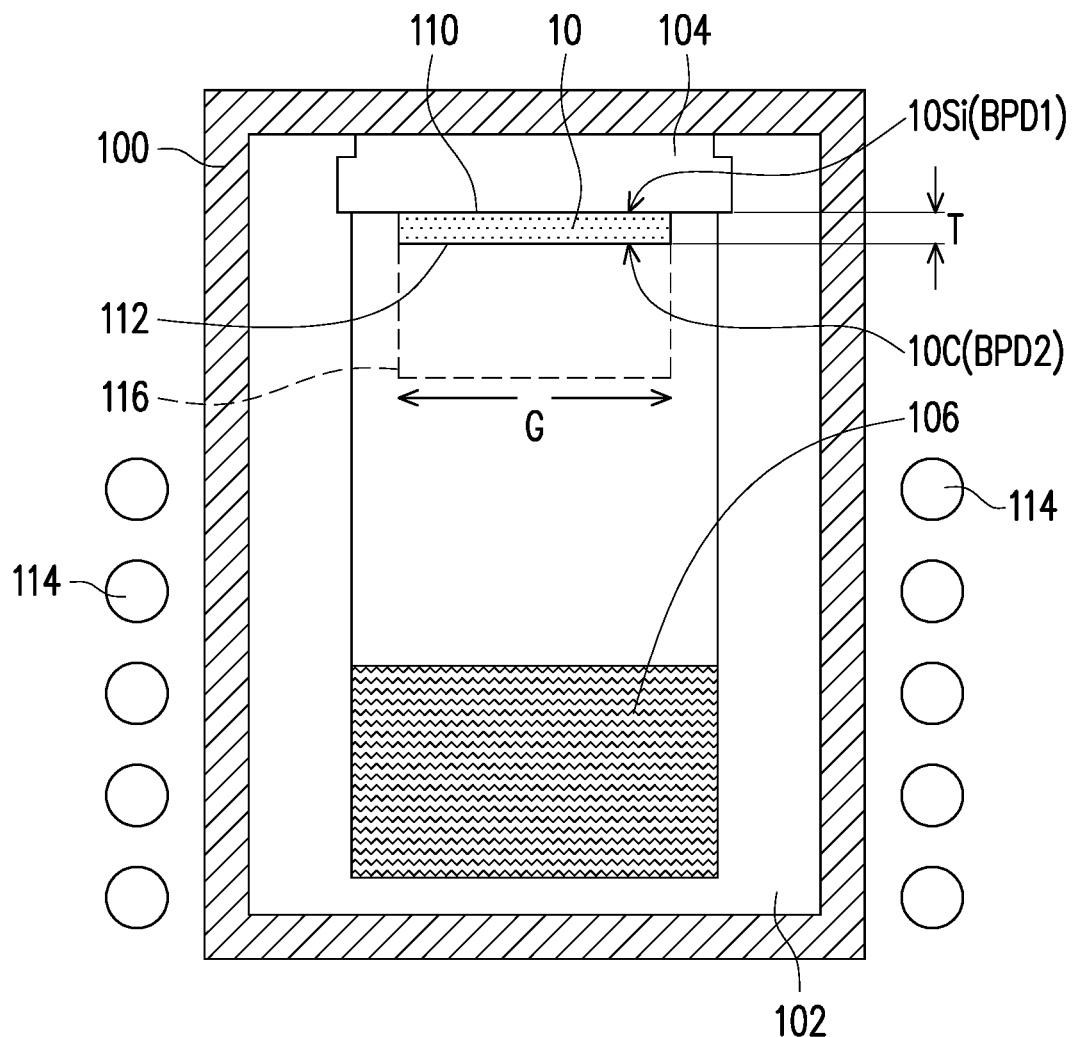
FIG. 3 is a schematic view of a silicon carbide seed crystal disposed in a physical vapor transport (PVT) device according to an embodiment of the disclosure.

FIG. 3 is a schematic view of a silicon carbide seed crystal disposed in a physical vapor transport (PVT) device according to an embodiment of the disclosure, which is illustrated with reference to the method of manufacturing a silicon carbide ingot in FIG. 2.

Referring to FIG. 3, in the embodiment, physical vapor transport (PVT) is an exemplary illustration and can be applied to all devices or manufacturing process that use PVT as a growth mechanism, and the disclosure is not limited to the PVT device shown in FIG. 2.

Referring to FIG. 3, a PVT device generally has a furnace 100, and a graphite crucible 102 and a crystal carrier 104 are disposed in the furnace 100. In step S200 of FIG. 2, the silicon carbide seed crystal 10 with a D of 25% or less, an LTV of 2.5 μm or less, and an SF density of 10 EA/cm² or less is disposed on the top of the crucible 102, and the silicon carbide based raw material 106 is disposed at the bottom of the graphite crucible 102. Moreover, in the embodiment, the surface of the carbon surface 10C of the silicon carbide seed crystal 10 facing the silicon carbide based raw material 106 is used as a growth surface 112, but the disclosure is not limited thereto. In other embodiments, the surface of the silicon surface 10Si facing the silicon carbide based raw material 106 can be used as the growth surface 112.

Referring to FIG. 3, an induction coil 114 is further disposed in the graphite crucible 102 for heating the silicon carbide based raw material 106 in the graphite crucible 102. In step S210 of FIG. 2, the silicon carbide based raw material 106 is heated, so the silicon carbide based raw material 106 is sublimated in the thermal field of the crucible 102. More specifically, when the induction coil 114 heats the silicon carbide based raw material 106 at the bottom of the graphite crucible 102 to a high temperature, the silicon carbide based raw material 106 may be decomposed and sublimated directly without being through the liquid phase.

Referring to FIG. 3, in step S220 of FIG. 2, the directly sublimated silicon carbide based raw material 106 is driven by the temperature gradient G and is transmitted to the low-temperature growth surface 112 of the silicon carbide seed crystal 10 to form nucleation and growth. Next, referring to FIG. 3, in step S230 of FIG. 2, the silicon carbide single crystal is continuously grown on the silicon carbide seed crystal 10, and a silicon carbide ingot 116 is finally grown.

Note that in the method of manufacturing the silicon carbide ingot of the disclosure, as shown in FIG. 3, the radial temperature gradient G of the thermal field in the crucible 102 is less than or equal to 50° C./cm. By controlling the radial temperature gradient G of the thermal field in the crucible 102, the silicon carbide ingot 116 is grown in the growth surface 112 of the silicon carbide seed crystal 10, and accordingly the silicon carbide ingot 116 with high quality and few defects can be grown. In the embodiment, the basal plane dislocation density BPD of the grown silicon carbide ingot is 300 EA/cm$^2$ or less, the stacking fault (SF) density is 10 EA/cm$^2$ or less, and the threading screw dislocation (TSD) density is 35 EA/cm$^2$ or less.

Based on the above, in the silicon carbide seed crystal 10 of the disclosure, by controlling the basal plane dislocation density difference between the silicon surface 10Si and the carbon surface 10C, the local thickness variation (LTV) of the silicon carbide seed crystal to be 2.5 μm or less, and the stacking fault (SF) density to be 10 EA/cm$^2$ or less, the crystal growth direction can be consistent and high-quality silicon carbide ingots with fewer defects can be processed. Moreover, by using the method of manufacturing the silicon carbide seed crystal of the disclosure, high-quality silicon carbide ingots with fewer defects can be processed.

Several experiments are illustrated below to verify the efficacy of the disclosure, but the experimental content is not intended to limit the scope of the disclosure.

Preparation Example 1-10

In the device shown in FIG. 3, different silicon carbide seed crystals are disposed on the top of the crucible, respectively, and the silicon carbide based raw material is disposed in the crucible to heat the silicon carbide based raw material. Different silicon carbide seed crystals are shown in Table 1. The silicon carbide seed crystals have different basal plane dislocation densities BPD, different basal plane dislocation density differences D, different local thickness variations (LTV), and different stacking fault (SF) densities. Moreover, the temperature in the crucible is adjusted to form different radial temperature gradients of the thermal field in the crucible, respectively.

As shown in Table 1, the temperature gradients of Comparative Examples 1-3 are greater than 50° C./cm, and the temperature gradients of Examples 1-7 are less than or equal to 50° C./cm. For example, in Example 1 of Table 1, a thermal field with a temperature gradient of 20° C./cm is formed in the crucible. Next, the silicon carbide based raw material is sublimated in the thermal field of the crucible.

Then, the sublimated silicon carbide is in contact with different silicon carbide seed crystals 10 disposed on the top of the crucible to grow silicon carbide single crystals on the seed crystals. The silicon carbide single crystal is continuously grown on the silicon carbide seed crystal 10 to obtain a silicon carbide ingot. The following seed crystal defect analysis and evaluation are performed on the obtained silicon carbide ingots.

<Evaluation of a Difference D, Local Thickness Variation (LTV), and Stacking Fault SF of a Seed Crystal>

The basal plane dislocation density difference D, local thickness variation LTV, and stacking fault (SF) density of the silicon carbide seed crystals are measured. The measured results are as shown in Table 1. With the detection method described in the previous paragraphs, the basal plane dislocation density difference D, the local thickness variation (LTV), and the stacking fault (SF) density of the seed crystal are detected, and the evaluation is as follows.

The silicon carbide seed crystals that meet all three requirements are evaluated as G, which represents good quality; and silicon carbide seed crystals that lack any of these requirements are evaluated as NG, which represents poor quality:

Requirement 1: The basal plane dislocation density difference D between the silicon surface and the carbon surface is 25% or less;
Requirement 2: The local thickness variation (LTV) is 2.5 μm or less; and
Requirement 3: The stacking fault (SF) density is 10 EA/cm$^2$ or less.

In other words, if any of the D, LTV, and SF of the silicon carbide seed crystal does not meet the requirements, the seed crystal is evaluated as NG, which represents poor quality. All three requirements of D, LTV, and SF must be met so that the seed crystal can be evaluated as G.

<The Basal Plane Dislocation Density (BPD), Stacking Fault (SF) Density, Threading Screw Dislocation (TSD) Density of an Ingot>

The basal plane dislocation density BPD, the stacking fault (SF) density, and the threading screw dislocation (TSD) density of the grown silicon carbide ingots are measured. The measured results are as shown in Table 1. The defects are evaluated as follows.

The measured seed crystal having a basal plane dislocation density BPD greater than 300 EA/cm$^2$, a stacking fault (SF) density greater than 10 EA/cm$^2$, a threading screw dislocation (TSD) density greater than 35 EA/cm$^2$ is evaluated as NG, which represents poor quality.

In contrast, the measured seed crystal having a basal plane dislocation density BPD less than or equal to 300 EA/cm$^2$, a stacking fault (SF) density less than or equal to 10 EA/cm$^2$, a threading screw dislocation (TSD) density less than or equal to 35 EA/cm$^2$ is evaluated as G, which represents good quality.

TABLE 1

| Preparation example | Comparative examples | | | Examples | | | | | | |
|---|---|---|---|---|---|---|---|---|---|---|
| Ingot | 1 | 2 | 3 | 1 | 2 | 3 | 4 | 5 | 6 | 7 |
| Seed crystal BPD 1 (EA/cm$^2$) | 955 | 1321 | 1232 | 185 | 123 | 102 | 97 | 260 | 80 | 298 |
| Seed crystal BPD 2 (EA/cm$^2$) | 851 | 995 | 988 | 163 | 119 | 94 | 83 | 218 | 76 | 239 |

TABLE 1-continued

| Preparation example | Comparative examples | | | Examples | | | | | | |
|---|---|---|---|---|---|---|---|---|---|---|
| Ingot | 1 | 2 | 3 | 1 | 2 | 3 | 4 | 5 | 6 | 7 |
| D | 12.22% | 32.76% | 24.70% | 13.50% | 3.36% | 8.51% | 16.87% | 19.27% | 5.26% | 24.69% |
| Temperature gradient (° C./cm) | 55 | 65 | 60 | 20 | 5 | 30 | 45 | 45 | 10 | 50 |
| Seed crystal LTV (um) | 6.8 | 3.3 | 2 | 0.5 | 0.3 | 1.4 | 1.5 | 1.5 | 0.5 | 1.5 |
| Seed crystal SF density (EA/cm$^2$) | 205 | 125 | 71 | 5 | 5 | 8 | 10 | 9 | 4 | 9 |
| Seed crystal evaluation | NG | NG | NG | G | G | G | G | G | G | G |
| Ingot SF density (EA/cm$^2$) | 222 | 211 | 153 | 9 | 4 | 7 | 10 | 8 | 5 | 10 |
| Ingot BPD density (EA/cm$^2$) | 2508 | 2312 | 1835 | 141 | 98 | 82 | 79 | 230 | 71 | 252 |
| Ingot TSD density (EA/cm$^2$) | 223 | 194 | 121 | 28 | 21 | 32 | 30 | 31 | 25 | 32 |
| Ingot evaluation | NG | NG | NG | G | G | G | G | G | G | G |

As shown in Comparative Examples 1 to 3 in Table 1, the basal plane dislocation density difference D of the silicon carbide seed crystal of Comparative Example 1 is 25% or less and meets requirement 1, but the local thickness variation (LTV) is greater than 2.5 μm and does not meet the requirement 2, and the stacking fault (SF) density is greater than 10 EA/cm$^2$ and does not meet requirement 3. Accordingly, the processed silicon carbide ingots grown from the silicon carbide seed crystal of Comparative Example 1 have the problem of many defects such as SF density, BPD density, and TSD density, and high-quality silicon carbide ingots cannot be grown. Moreover, the silicon carbide seed crystal of Comparative Example 2 has a basal plane dislocation density difference D greater than 25%, a local thickness variation (LTV) greater than 2.5 μm, and a stacking fault (SF) density greater than 10 EA/cm$^2$, that is, the silicon carbide seed crystal of Comparative Example 2 does not meet the requirements 1 to 3. According to Table 1, the processed silicon carbide ingots grown from the silicon carbide seed crystal of Comparative Example 2 have the problems of multiple defects and poor quality. Moreover, the basal plane dislocation density difference D of the silicon carbide seed crystal of Comparative Example 3 is less than 25% and meets requirement 1, the local thickness variation LTV is 2 μm and meets requirement 2, but the stacking fault (SF) density is greater than 10 EA/cm$^2$ and does not meet requirement 3, and the processed silicon carbide crystals grown from the silicon carbide seed crystal of Comparative Example 3 still have the problems of multiple defects and poor quality.

In contrast, in the silicon carbide seed crystals of Examples 1 to 7 as shown in Table 1, the basal plane dislocation density difference between the silicon surface and the carbon surface is D≤25%, the local thickness variation (LTV) is 2.5 μm or less, and the stacking fault (SF) density is 10 EA/cm$^2$ or less. The silicon carbide seed crystals that meet requirements 1 to 3 can be used as seed crystals for growing a silicon carbide ingot, and accordingly silicon carbide ingots with fewer defects and good quality are processed.

Moreover, according to the comparison between the quality of silicon carbide ingots grown from the silicon carbide seed crystals of Examples 1 to 7 and that of silicon carbide ingots grown from the silicon carbide seed crystals of Comparative Examples 1 to 3, when the temperature gradient is less than or equal to 50° C./cm, the crystal growth process is more stable and there are fewer defects. However, if the temperature gradient is less than 5° C./cm, ingots cannot be grown. Moreover, if the temperature gradient is too low, it takes long time to process ingots, and the temperature gradient may preferably be greater than or equal to 5° C./cm. On the contrary, if the temperature gradient is too high, the ingot growth may be fast, which may cause more defects in the grown silicon carbide ingots, which may affect the ingot quality and the yield of the subsequent processing process. Therefore, the temperature gradient should preferably be less than or equal to 50° C./cm.

In summary, in the silicon carbide seed crystal of the disclosure, the basal plane dislocation density difference D between the growth surface and the opposite surface is less than or equal to 25%, the LTV is 2.5 μm or less, and the SF density is 10 EA/cm$^2$ or less, so the basal plane dislocation density BPD of the silicon carbide ingot grown from the seed crystal is 300 EA/cm$^2$ or less, the stacking fault (SF) density is 10 EA/cm$^2$ or less, and the threading screw dislocation (TSD) density is 35 EA/cm$^2$ or less, and thus the quality of the film formed by the subsequent epitaxy can be ensured.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A silicon carbide seed crystal, wherein the silicon carbide seed crystal comprises a silicon surface and a carbon surface opposite to the silicon surface, wherein a difference D between a basal plane dislocation density BPD1 of the silicon surface and a basal plane dislocation density BPD2 of the carbon surface satisfies a formula (1) as follows:

D=(BPD1−BPD2)/BPD1≤25% (1), wherein a local thickness variation (LTV) of the silicon carbide seed crystal is 2.5 μm or less, and a stacking fault (SF) density of the silicon carbide seed crystal is 10 EA/cm² or less.

2. The silicon carbide seed crystal according to claim 1, wherein the basal plane dislocation density difference D between the silicon surface and the carbon surface is 20% or less.

3. The silicon carbide seed crystal according to claim 1, wherein the basal plane dislocation density difference D between the silicon surface and the carbon surface is 15% or less.

4. The silicon carbide seed crystal according to claim 1, wherein the local thickness variation (LTV) of the silicon carbide crystal is 1.5 μm or less.

5. The silicon carbide seed crystal according to claim 1, wherein the stacking fault (SF) density is 5 EA/cm² or less.

* * * * *